(12) United States Patent
Yamawaku et al.

(10) Patent No.: US 9,349,618 B2
(45) Date of Patent: May 24, 2016

(54) SUBSTRATE PROCESSING APPARATUS

(75) Inventors: Jun Yamawaku, Nirasaki (JP); Chishio Koshimizu, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 1097 days.

(21) Appl. No.: 13/344,267

(22) Filed: Jan. 5, 2012

(65) Prior Publication Data

US 2012/0175063 A1 Jul. 12, 2012

Related U.S. Application Data

(60) Provisional application No. 61/435,094, filed on Jan. 21, 2011.

(30) Foreign Application Priority Data

Jan. 7, 2011 (JP) .................................. 2011-002251

(51) Int. Cl.
| | | |
|---|---|---|
| *H01L 21/3065* | (2006.01) | |
| *H01L 21/67* | (2006.01) | |
| *H01J 37/32* | (2006.01) | |
| *H01L 21/687* | (2006.01) | |

(52) U.S. Cl.
CPC ..... *H01L 21/67069* (2013.01); *H01J 37/32477* (2013.01); *H01J 37/32559* (2013.01); *H01J 37/32642* (2013.01); *H01L 21/68735* (2013.01)

(58) Field of Classification Search
CPC ................................................ H01J 37/32642
USPC .................................................. 156/345.37
See application file for complete search history.

(56) References Cited

U.S. PATENT DOCUMENTS

| | | | | |
|---|---|---|---|---|
| 5,445,675 | A | * | 8/1995 | Kubodera et al. .............. 118/719 |
| 6,570,134 | B2 | * | 5/2003 | Suzuki et al. .................. 219/390 |
| 6,676,804 | B1 | * | 1/2004 | Koshimizu et al. ....... 156/345.53 |
| 2007/0051472 | A1 | * | 3/2007 | Murakami et al. ........ 156/345.51 |
| 2010/0213171 | A1 | | 8/2010 | Koshimizu et al. |

FOREIGN PATENT DOCUMENTS

| | | |
|---|---|---|
| JP | 2008244274 | 10/2008 |
| JP | 2010251723 | 11/2010 |
| JP | 2011-071464 | 4/2011 |

* cited by examiner

*Primary Examiner* — Keath Chen
*Assistant Examiner* — Aiden Lee
(74) *Attorney, Agent, or Firm* — Cantor Colburn LLP

(57) ABSTRACT

A substrate processing apparatus capable of removing deposits attached on a component of a lower temperature in a gap between two components, temperatures of which are greatly different from each other, without degrading a working ratio of the substrate processing apparatus. In the substrate processing apparatus, a chamber receives a wafer, a focus ring surrounds the wafer disposed in the chamber, a side surface protective member transmits a laser beam, a laser beam irradiating apparatus irradiates the laser beam to the side surface protective member, an inner focus ring of the focus ring is disposed adjacent to the wafer and is cooled down and an outer focus ring surrounds the inner focus ring and is not cooled down in a focus ring, and a facing surface of the side surface protective member faces a gap between the inner focus ring and the outer focus ring.

4 Claims, 11 Drawing Sheets

US 9,349,618 B2

SUBSTRATE PROCESSING APPARATUS

CROSS-REFERENCE TO RELATED PATENT APPLICATIONS

This application claims the benefit of Japanese Patent Application No. 2011-002251 filed on Jan. 7, 2011, in the Japan Patent Office and U.S. Patent Application Ser. No. 61/435,094, filed on Jan. 21, 2011, in the United States Patent and trademark Office, the disclosure of which are incorporated herein in their entireties by reference.

BACKGROUND OF THE INVENTION

1. Field of the Invention

The present invention relates to a substrate processing apparatus including a focus ring.

2. Description of the Related Art

Recently, semiconductor wafers (hereinafter, simply referred to as 'wafers') from which semiconductor devices are fabricated have been enlarged, and accordingly, it is required that semiconductor devices be obtained from peripheral portions of wafers, for example, a range within 10 mm toward centers of wafers from peripheries of the wafers. However, since distribution of radicals in plasma used to process a wafer is affected by a temperature distribution of an object, a temperature of a peripheral portion of a wafer needs to be controlled to be nearly similar to temperatures of other portions on the wafer in order to perform a uniform process using radicals on the entire wafer. Therefore, conventionally, a technology for adjusting and cooling a temperature of a focus ring has been developed in order to reduce radiation heat of a focus ring.

However, when a temperature of an entire wafer is excessively lowered by cooling a focus ring, a resist film applied on the wafer as a pattern mask may be easily trimmed by plasma. Thus, in order to prevent a temperature of an entire wafer from excessively being lowered, a technology of providing an additional focus ring (hereinafter, referred to as an 'outer focus ring') on an outer side of the focus ring (hereinafter, referred to as an 'inner focus ring') that is cooled down, and then, instead of cooling the additional focus ring, actively heating the additional focus ring has been developed by the present applicant (for example, refer to Patent Document 1).

However, in general, in a gap between two components having temperatures largely different from each other, deposits are likely to be attached on the component having the lower temperature, and thus the present inventor identified that deposits are easily attached to the inner focus ring in a gap between the two focus rings, when the above so-called 2-partition focus ring including the inner focus ring and the outer focus ring is used.

Since the gap between the inner focus ring and the outer focus ring is narrow and it is difficult for plasma to enter the gap, it is difficult to remove deposits attached onto the inner focus ring by using an ashing process or the like. Therefore, in order to remove deposits, a chamber is opened to atmosphere to take out the inner focus ring, and deposits need to be cleaned from the inner focus ring. Accordingly, a working ratio of a substrate processing apparatus is degraded.

In addition, in the substrate processing apparatus, a susceptor on which the inner focus ring or the outer focus ring is placed is cooled down to a temperature that is lower than that of the inner focus ring, and thus a temperature difference between the inner focus ring and the susceptor is increased and deposits are also attached to the susceptor in a gap between the inner focus ring and the susceptor.

Since the gap between the inner focus ring and the susceptor is also narrow, the chamber is opened to atmosphere to take out the inner focus ring and expose the susceptor, and then the inner focus ring and the susceptor are cleaned in order to remove deposits. Accordingly, the working ratio of the substrate processing apparatus is also degraded.

(Patent Document 1) Japanese Patent Application No. 2010-021079

SUMMARY OF THE INVENTION

The present invention provides a substrate processing apparatus capable of removing deposits attached on a component having a lower temperature in a gap between two components having a large temperature difference, without degrading a working ratio of the substrate processing apparatus.

According to an aspect of the present invention, there is provided a substrate processing apparatus including: a processing chamber which receives a substrate; a focus ring which surrounds a periphery of the substrate disposed in the processing chamber; a laser beam transmission member which transmits a laser beam; and a laser beam irradiating apparatus which irradiates the laser beam to the laser beam transmission member, wherein the focus ring comprises an inner focus ring which is disposed adjacent to the substrate and is cooled down, and an outer focus ring that surrounds the inner focus ring and is not cooled down, and the laser beam transmission member has a facing surface that faces a gap between the inner focus ring and the outer focus ring.

The laser beam transmission member may be formed of quartz, the outer focus ring may be formed of silicon or silicon carbide, and the laser beam may have a wavelength of 1100 nm or less.

The laser beam irradiating apparatus may also irradiate laser beams that are different from the laser beam having the wavelength of 1100 nm or less.

The inner focus ring and the outer focus ring may be formed of silicon or silicon carbide, and the laser beam may have a wavelength greater than 1100 nm.

According to another aspect of the present invention, there is provided a substrate processing apparatus including: a processing chamber which receives a substrate; a focus ring which surrounds a periphery of the substrate disposed in the processing chamber; and a focus ring moving apparatus which moves the focus ring, wherein the focus ring comprises an inner focus ring which is disposed adjacent to the substrate and is cooled down, and an outer focus ring that surrounds the inner focus ring and is not cooled down, and the focus ring moving apparatus moves at least one of the inner focus ring and the outer focus ring such that a gap between the inner focus ring and the outer focus ring is exposed to a processing space where plasma is generated in the processing chamber.

The focus ring moving apparatus may be a pusher pin which moves at least one of the inner focus ring and the outer focus ring.

According to another aspect of the present invention, there is provided a substrate processing apparatus including: a processing chamber which receives a substrate; a focus ring which surrounds a periphery of the substrate disposed in the processing chamber; and a plasma biasing apparatus which biases plasma in the processing chamber, wherein the focus ring comprises an inner focus ring which is disposed adjacent to the substrate and is cooled down, and an outer focus ring that surrounds the inner focus ring and is not cooled down, and the plasma biasing apparatus increases a density of plasma facing a gap between the inner focus ring and the outer focus ring.

The plasma biasing apparatus may include a conductor member or a semiconductor member of a ground potential which is disposed around the outer focus ring.

The plasma biasing apparatus may include a ground electrode disposed near the outer focus ring.

The plasma biasing apparatus may include an electrode to which a positive direct current voltage is applied, disposed near the outer focus ring.

The plasma biasing apparatus may include a magnetic field generator disposed near the gap between the outer focus ring and the inner focus ring.

BRIEF DESCRIPTION OF THE DRAWINGS

The above and other features and advantages of the present invention will become more apparent by describing in detail exemplary embodiments thereof with reference to the attached drawings in which:

FIGS. 2A and 2B are magnified cross-sectional views schematically showing a configuration around a focus ring included in the substrate processing apparatus according to the present embodiment, wherein FIG. 2A shows the substrate processing apparatus according to the present embodiment and FIG. 2B shows a modified example of the substrate processing apparatus according to the present embodiment;

FIGS. 3A and 3B are magnified cross-sectional views schematically showing a configuration around a focus ring included in a substrate processing apparatus according to another embodiment of the present invention, wherein FIG. 3A shows the substrate processing apparatus according to the another embodiment of the present invention and FIG. 3B shows a modified example of the substrate processing apparatus according to the another embodiment of the present invention;

FIGS. 4A through 4D are magnified cross-sectional views schematically showing a configuration around a focus ring included in a substrate processing apparatus according to another embodiment of the present invention, wherein FIG. 4A shows the substrate processing apparatus according to the another embodiment of the present invention, FIG. 4B shows a first modified example of the substrate processing apparatus according to the another embodiment, FIG. 4C shows a second modified example of the substrate processing apparatus according to the another embodiment, and FIG. 4D shows a third modified example of the substrate processing apparatus according to the another embodiment;

FIGS. 5A through 5F are magnified cross-sectional views schematically showing a configuration of a focus ring included in a substrate processing apparatus that may restrain attachment of deposits, wherein FIG. 5A shows a first example, FIG. 5B shows a second example, FIG. 5C shows a third example, FIG. 5D shows a fourth example, FIG. 5E shows a fifth example, and FIG. 5F shows a sixth example;

FIGS. 6A through 6D are magnified cross-sectional views schematically showing a configuration of a focus ring included in a substrate processing apparatus that may restrain attachment of deposits, wherein FIG. 6A shows a seventh example, FIG. 6B shows an eighth example, FIG. 6C shows a ninth example, and FIG. 6D shows a tenth example;

FIGS. 7A and 7B are magnified cross-sectional view schematically showing a configuration of a focus ring included in a substrate processing apparatus, wherein FIG. 7A shows an eleventh example and FIG. 7B shows a twelfth example.

DETAILED DESCRIPTION OF THE INVENTION

Hereinafter, embodiments of the present invention will be described with reference to accompanying drawings.

First, a substrate processing apparatus according to a first embodiment of the present invention will be described.

Figure 1:
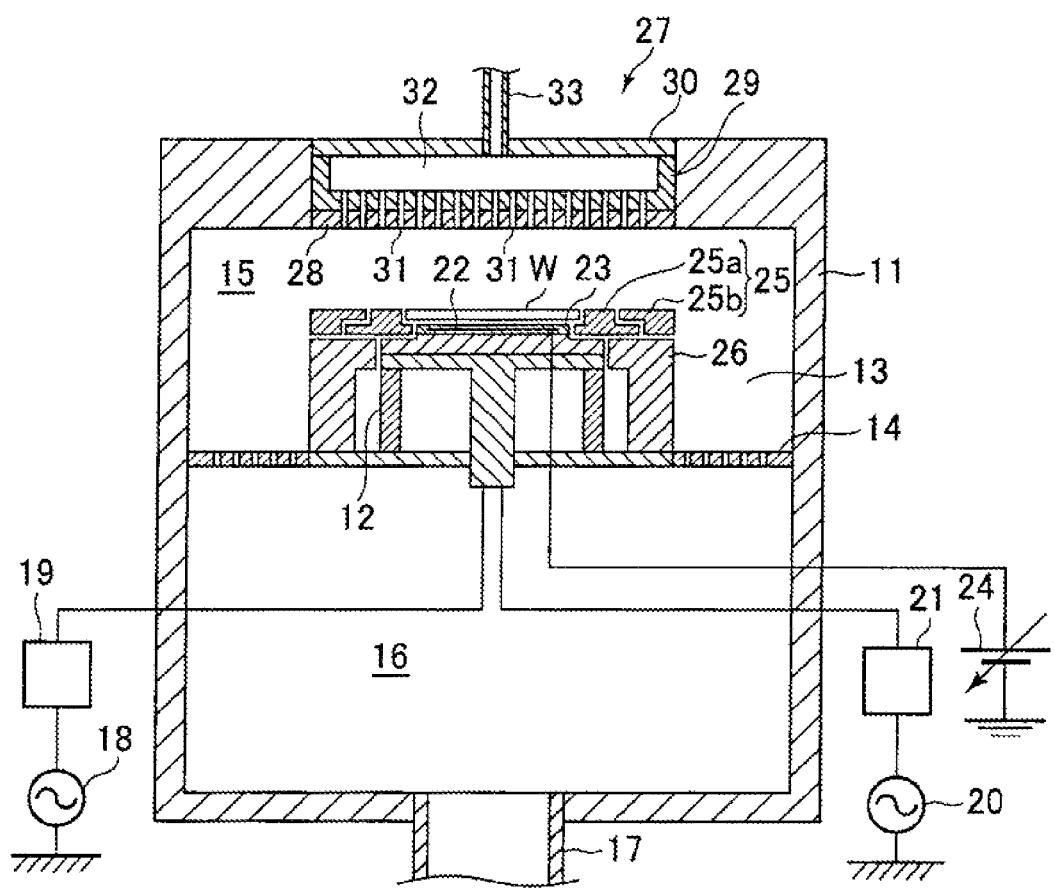
FIG. 1 is a schematic diagram showing a configuration of a substrate processing apparatus according to an embodiment of the present invention.

FIG. 1 is a diagram schematically showing a configuration of a substrate processing apparatus 10 according to the present embodiment. The substrate processing apparatus 10 of the present embodiment performs a plasma etching process on a wafer for forming semiconductor devices (hereinafter, simply referred to as 'wafer') as a substrate.

Referring to FIG. 1, the substrate processing apparatus 10 includes a chamber 11 for receiving a wafer W having a diameter of, for example, 300 mm, and a susceptor 12 (holding stage) formed as a cylinder on which the wafer W is placed is disposed in the chamber 11. In the substrate processing apparatus 10, a side exhaust passage 13 is formed by an inner side wall of the chamber 11 and a side surface of the susceptor 12. An exhaust plate 14 is disposed at an intermediate portion of the side exhaust passage 13.

The exhaust plate 14 is formed as a plate-shaped member having a plurality of through-holes, and functions as a partition plate that divides an inside of the chamber 11 into an upper portion and a lower portion. The upper portion (hereinafter, referred to as 'processing chamber 15') in the chamber 11, which is divided by the exhaust plate 14, has an inner space (processing space) where plasma is generated, as will be described later. An exhaust pipe 17 for discharging a gas in the chamber 11 is connected to the lower portion (hereinafter, referred to as an 'exhaust chamber (manifold) 16') in the chamber 11. The exhaust plate 14 captures or reflects plasma generated in the processing chamber 15 to prevent the plasma from leaking to the manifold 16.

A turbo molecular pump (TMP) and a dry pump (DP) (both not shown) are connected to the exhaust pipe 17, and the TMP and the DP depressurize the inside of the chamber 11 through a vacuum suction. In more detail, the DP depressurizes the inside of the chamber 11 from atmospheric pressure to a medium vacuum state (for example, equal to or less than $1.3 \times 10$ Pa (0.1 Torr)), and the TMP decompresses the inside of the chamber 11 to a high vacuum state (for example, equal to or less than $1.3 \times 10^{-3}$ Pa ($1.0 \times 10^{-5}$ Torr)) that is lower pressure than the medium vacuum state, in cooperation with the DP. The pressure in the chamber 11 is controlled by an APC valve (not shown).

A first radio frequency (RF) power source 18 is connected to the susceptor 12 in the chamber 11 via a first matcher 19, a second RF power source 20 is additionally connected to the susceptor 12 via a second matcher 21. The first RF power source 18 applies an RF power of a relatively low frequency, for example, 2 MHz, to the susceptor 12 for ion implantation, and the second RF power source 20 applies an RF power of a relatively high frequency, for example, 60 MHz, to the susceptor 12 for generating plasma. Accordingly, the susceptor 12 operates as an electrode. In addition, the first matcher 19 and the second matcher 21 reduce reflection of the RF powers from the susceptor 12, and thereby increasing efficiency of applying the RF powers to the susceptor 12.

A step is formed on an upper peripheral portion of the susceptor 12 so that a center portion of the susceptor 12 may protrude toward an upper portion in the drawing. An electrostatic chuck 23 formed of ceramic and including an electrostatic electrode plate 22 therein is disposed on a leading edge of the center portion of the susceptor 12. A direct current power source 24 is connected to the electrostatic electrode plate 22. When a positive direct current voltage is applied to the electrostatic electrode plate 22, negative electric potential is generated on a surface of the wafer W facing the electrostatic chuck 23 (hereinafter, referred to as a 'rear surface'), and thus a potential difference is generated between the electrostatic electrode plate 22 and the rear surface of the wafer W. Then, the wafer W is adsorbed and held against the electrostatic chuck 23 by Coulomb force or Johnson-Rahbek force caused by the potential difference.

The susceptor 12 includes a cooling unit (not shown) formed of a refrigerant passage therein, and the cooling unit absorbs heat of the wafer W, a temperature of which rises due to contact with plasma, via the susceptor 12 to prevent the temperature of the wafer W from rising over a desired temperature.

The susceptor 12 is formed of a conductor, for example, aluminum, in consideration of a heat transferring efficiency or an electrode function; however, a side surface of the susceptor 12 is covered by a side surface protective member 26 formed of a dielectric, for example, quartz ($SiO_2$), in order to prevent the conductor from being exposed to the processing chamber 15 where plasma is generated.

On an upper portion of the susceptor 12, a focus ring 25 is placed on the step (holding stage) of the susceptor 12 or the side surface protective member 26 so as to surround the wafer W adsorbed and held against the electrostatic chuck 23. The focus ring 25 is a two-partition focus ring including an inner focus ring 25a surrounding the wafer W and an outer focus ring 25b surrounding the inner focus ring 25a. The inner focus ring 25a and the outer focus ring 25b are formed of silicon (Si) or silicon carbide (SiC). That is, since the focus ring 25 is formed of a semi-conductor, a distribution range of plasma may be expanded to an upper portion of the focus ring 25, as well as an upper portion of the wafer W, and thus a density of plasma on a peripheral portion of the wafer W may be maintained at about the same level as that of plasma on a center portion of the wafer W. Accordingly, uniformity of a plasma etching process that is performed on the entire surface of the wafer W may be ensured.

Figure 5A:
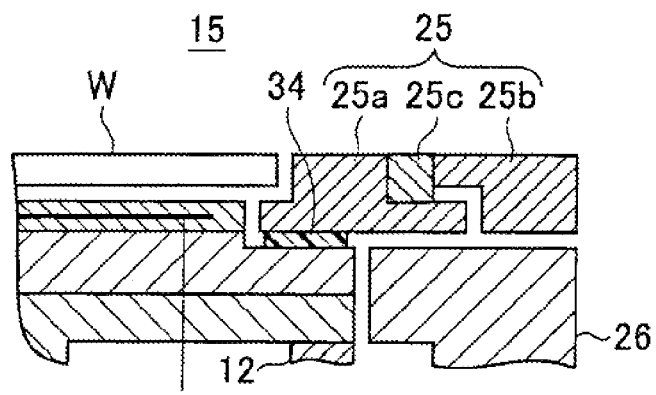

The inner focus ring 25a is mainly placed on the step of the susceptor 12, and the outer focus ring 25b is mainly placed on the side surface protective member 26. In addition, as shown in FIG. 5A that will be described later, a heat transferring sheet 34 formed of a heat transferring silicon rubber or the like having a heat transferring property is disposed between the inner focus ring 25a and the susceptor 12. The heat transferring sheet 34 transfers heat of the inner focus ring 25a, a temperature of which is increased due to contact with plasma, to the susceptor 12 so that the heat may be absorbed by the cooling unit of the susceptor 12. Since there is nothing between the outer focus ring 25b and the side surface protective member 26, when an inner space of the processing chamber 15 is depressurized, a vacuum heat insulating layer is generated between the outer focus ring 25b and the side surface protective member 26. Heat of the outer focus ring 25b, a temperature of which rises due to contact with plasma, is not transferred to the side surface protective member 26, and accordingly, the outer focus ring 25b is not cooled down, and the outer focus ring 25b is maintained at a high temperature. Therefore, the temperature of the inner focus ring 25a may be maintained at a desired low temperature, and at the same time, the outer focus ring 25b may be maintained at a high temperature.

A shower head 27 is disposed on a ceiling portion of the chamber 11 to face the susceptor 12. The shower head 27 includes an upper electrode plate 28, a cooling plate 29 that detachably holds the upper electrode plate 28, and a cover body 30 for covering the cooling plate 29. The upper electrode plate 28 is a disc-shaped member including a plurality of gas holes 31 penetrating through the upper electrode plate 28 in a thickness direction thereof. A buffer chamber 32 is provided in the cooling plate 29, and a processing gas inducing pipe 33 is connected to the buffer chamber 32.

In the substrate processing apparatus 10, a processing gas that is supplied into the buffer chamber 32 through the processing gas inducing pipe 33 is introduced into the inner space of the processing chamber 15 via the gas holes 31. The introduced processing gas is excited by the RF power for generating plasma applied to the inner space of the processing chamber 15 via the susceptor 12 from the second RF power source 20, and becomes plasma. Ions in the plasma are attracted by the RF power for ion implantation applied from the first RF power source 18 to the susceptor 12 toward the wafer W, and then a plasma etching process is performed with respect to the wafer W.

While plasma etching process is performed with respect to the wafer W, reaction products generated from a reaction between an etched layer of the wafer W and plasma float in the inner space of the processing chamber 15, and are attached to each of components in the processing chamber 15 as deposits. In particular, deposits are likely to be attached to a component having a low temperature in a gap between two components having a large temperature difference therebetween, and thus deposits are attached to the inner focus ring 25a in a gap between the inner focus ring 25a and the outer focus ring 25b. The gap between the inner focus ring 25a and the outer focus ring 25b is narrow and shows a labyrinth-like structure, and accordingly it is difficult to remove deposits attached on the inner focus ring 25a without taking out the inner focus ring 25a from the chamber 11. To deal with the above problem, a configuration that will be described as follows is provided according to the present embodiment.

Figure 2A:
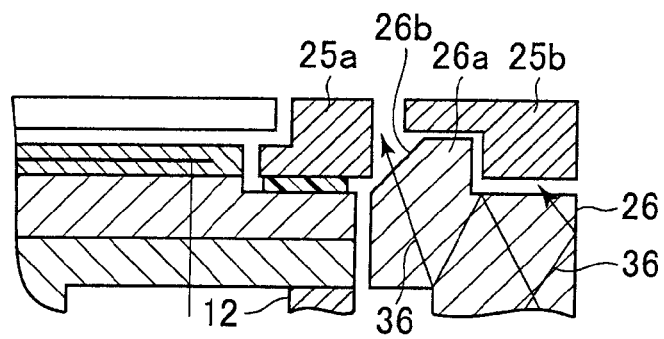
Figure 2B:
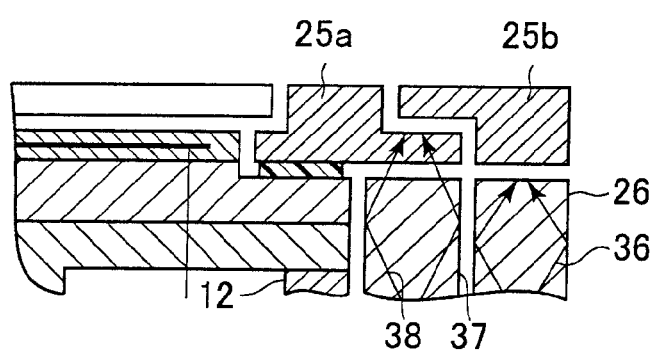

FIGS. 2A and 2B are magnified cross-sectional views schematically showing a configuration around the focus ring included in the substrate processing apparatus according to the present embodiment, wherein FIG. 2A shows the substrate processing apparatus according to the present embodiment, and FIG. 2B shows a modified example of the substrate processing apparatus according to the present embodiment.

Referring to FIG. 2A, the side surface protective member 26 (a laser beam transmission member) may be formed of a material for transmitting a laser beam, for example, quartz, and has a protrusion 26a protruding upward toward the gap (hereinafter, referred to as 'first gap') between the inner focus ring 25a and the outer focus ring 25b. A facing surface 26b facing the inner focus ring 25a in the first gap is formed on the protrusion 26a. Also, a laser beam irradiating apparatus (not shown) is disposed on a lower portion of the side surface protective member 26 in the drawing, and the laser beam irradiating apparatus irradiates a laser beam 36 of a wavelength of, for example, about 1100 nm or less for heating the focus ring toward the side surface protective member 26.

The laser beam 36 incident into the side surface protective member 26 is repeatedly reflected by inner surfaces of the side surface protective member 26, and then is irradiated to the outer focus ring 25b from an upper portion of the side surface protective member 26. Since the outer focus ring 25b is formed of Si or SiC, the outer focus ring 25b absorbs the laser beam 36 having the wavelength of 1100 nm or less, and then is heated by energy of the absorbed laser beam 36. Here, since the facing surface 26b of the protrusion 26a faces the inner focus ring 25a in the first gap, some of the laser beam 36 is irradiated toward the inner focus ring 25a from the facing surface 26b. Some of the laser beam 36 is absorbed by deposits attached on the inner focus ring 25a and thus a temperature of the deposits is raised, thereby promoting decomposition and removal of the deposits. Accordingly, there is no need to wash the inner focus ring 25a clean of deposits, and thus deposits attached on the inner focus ring 25a having a low temperature in the first gap, in which there is a large temperature difference, may be removed without degrading a working ratio of the substrate processing apparatus 10.

In addition, when a temperature of deposits is not sufficiently increased because a light intensity of the laser beam 36 for heating the focus ring by irradiating on the inner focus ring 26a is low, a laser beam that is different from the laser beam 36 for heating the focus ring, for example, a laser beam that may be absorbed efficiently by deposits, may be irradiated on the side surface protective member 26 such that some of the laser beam different from the laser beam 36 may be irradiated to the inner focus ring 25a from the facing surface 26b. Accordingly, a temperature of deposits may be increased sufficiently and efficiently.

In addition, if a laser beam can not be directly irradiated toward the first gap, for example, if the first gap has the labyrinth-like structure, as shown in FIG. 2B, for example, a laser beam guide member 37 (laser beam transmission member) formed of quartz is disposed between the susceptor 12 and the side surface protective member 26 to face the first gap, separately from the side surface protective member 26. The other laser beam irradiating apparatus (not shown) is disposed on a lower portion of the laser beam guide member 37 on the drawing, and the other laser beam irradiating apparatus irradiates, for example, a laser beam 38 having a wavelength of 1100 nm or greater toward the laser beam guide member 37.

The laser beam 38 incident in the laser beam guide member 37 is repeatedly reflected by inner surfaces of the laser beam guide member 37, while passing through the laser beam guide member 37, and then is irradiated to the first gap from an upper portion of the laser beam guide member 37. Here, although a part of the inner focus ring 25a or a part of the outer focus ring 25b, for example, exists on an optical path of the laser beam 38 since the first gap shows a labyrinth-like structure, the silicon or the silicon carbide transmits the laser beam having the wavelength of 1100 nm or greater, and thus the laser beam 38 may reach the first gap after passing through the part of the inner focus ring 25a or the outer focus ring 25b. Then, the laser beam 38 is absorbed by deposits in the first gap, and thereby rising a temperature of the deposits. Accordingly, the decomposition and removal of deposits in the first gap may be accelerated.

When a component or a member for absorbing a laser beam is not disposed between the first gap and the other laser beam irradiating apparatus, the other laser beam irradiating apparatus may be disposed around a side wall of the chamber 11 or around a cover on an upper portion of the chamber 11, as well as below the laser beam guide member 37. In this case, the other laser beam irradiating apparatus may be directed toward the first gap.

Next, a substrate processing apparatus according to a second embodiment of the present invention will be described.

The substrate processing apparatus according to the present embodiment basically has the same structures and the same operations as those of the substrate processing apparatus according to the first embodiment, and thus descriptions about the same structures and the same operations are not provided here, and different configurations and operations from those of the previous embodiment will be described as follows.

Figure 3A:
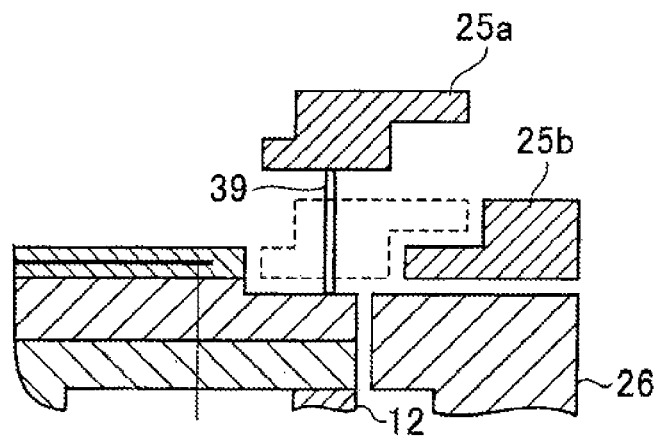
Figure 3B:
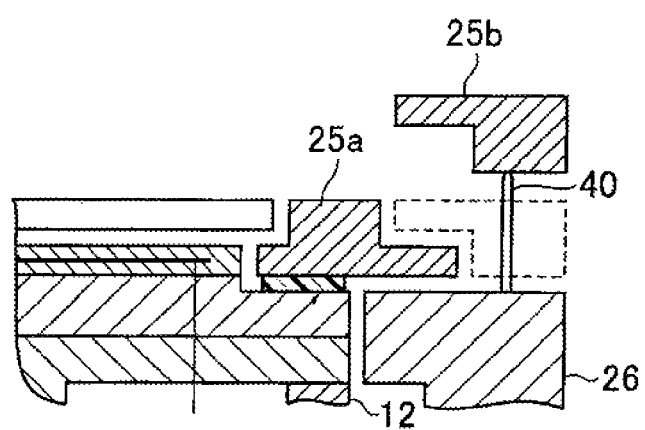

FIGS. 3A and 3B are magnified cross-sectional views schematically showing a structure around a focus ring included in the substrate processing apparatus 10 according to the present embodiment, wherein FIG. 3A shows the substrate processing apparatus 10 according to the present embodiment and FIG. 3B shows a modified example of the substrate processing apparatus 10 according to the present embodiment.

Referring to FIG. 3A, the substrate processing apparatus 10 further includes a pusher pin 39 (focus ring moving apparatus) that freely protrudes from the step of the susceptor 12. When the pusher pin 39 protrudes upward, the pusher pin 39 lifts the inner focus ring 25a such that the inner focus ring 25a may be separated from the outer focus ring 25b. In general, when deposits contact plasma, the deposits are decomposed and removed due to chemical reaction with radicals. Here, since the inner focus ring 25a that is lifted by the pusher pin 39 is exposed to the plasma in the inner space of the processing chamber 15, decomposition and removal of deposits that are attached on the inner focus ring 25a may be accelerated. Accordingly, there is no need to wash the deposits attached on the inner focus ring 20a having the lower temperature in the first gap where there is a large temperature difference without degrading the working ratio of the substrate processing apparatus 10.

As shown in FIG. 3B, the substrate processing apparatus 10 additionally includes a pusher pin 40 (focus ring moving apparatus) that freely protrudes from an upper surface of the side surface protective member 26. When the pusher pin 40 protrudes upward, the outer focus ring 25b is lifted so as to be separated from the inner focus ring 25a. In the present modified example, since the outer focus ring 25b is separated from the inner focus ring 25a, deposits attached on the inner focus ring 25a are exposed to plasma in the inner space of the processing chamber 15. Accordingly, decomposition and removal by plasma of deposits attached on the inner focus ring 25a are accelerated, and thus deposits may be removed without washing the inner focus ring 25a, having the lower temperature in the first gap, clean of deposits.

Removal of deposits in the present embodiment is performed when a wafer-less dry cleaning (WLDC) process is performed in the substrate processing apparatus 10. In the present embodiment, the pusher pin is used to move the inner focus ring 25a or the outer focus ring 25b, and thus the configuration of the substrate processing apparatus 10 may not be complicated.

Next, a substrate processing apparatus according to a third embodiment of the present invention will be described.

The substrate processing apparatus according to the present embodiment basically has the same structures and the same operations as those of the substrate processing apparatus according to the first embodiment, and thus descriptions about the same structures and the same operations are not provided here, different configurations and operations from those of the first embodiment will be described as follows.

In the substrate processing apparatus 10 shown in FIG. 1, a gap of a predetermined width is formed between the side surface of the susceptor 12 and an inner side surface of the inner focus ring 25a in order to easily attach/detach the focus ring 25 to/from the susceptor 12. However, the susceptor 12 is directly cooled down by the cooling unit built therein, and accordingly, a temperature of susceptor 12 is much lower than the temperature of the inner focus ring 25a. That is, in the gap between the side surface of the susceptor 12 and the inner side surface of the inner focus ring 25a (hereinafter, referred to as a 'second gap'), a difference between the temperatures of the susceptor 12 and the inner focus ring 25a is great. Therefore, deposits are attached on the susceptor 12 in the second gap.

Thus, in the present embodiment, plasma is biased to face the second gap, as well as the first gap.

Figure 4A:
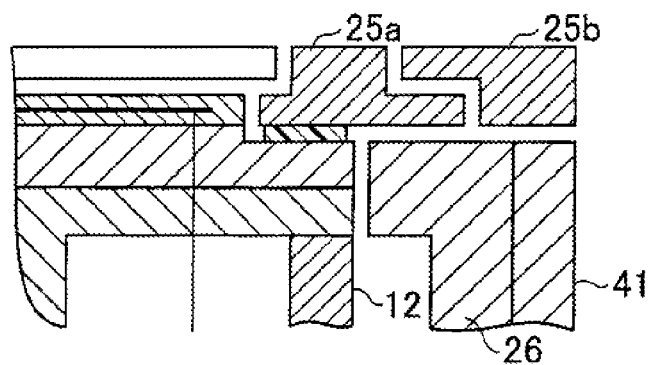
Figure 4B:
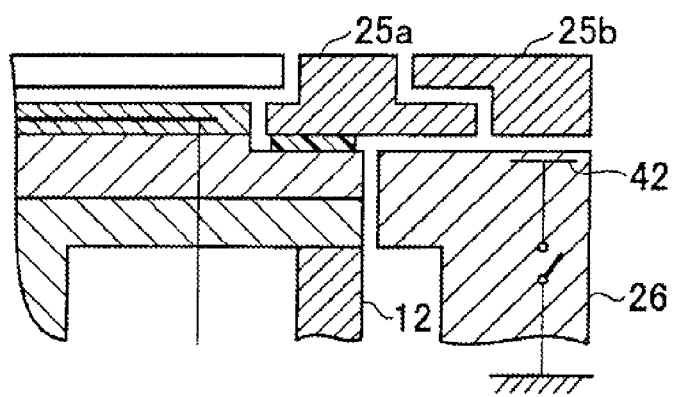
Figure 4C:
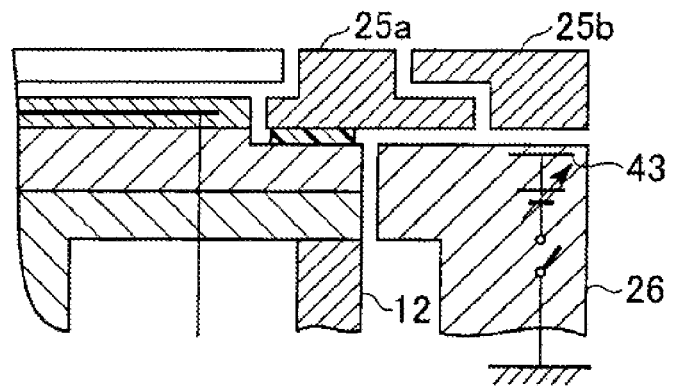
Figure 4D:
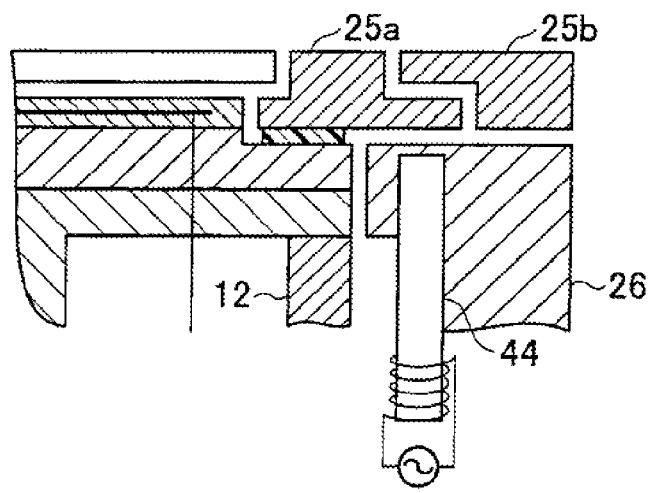

FIGS. 4A through 4D are magnified cross-sectional views schematically showing a configuration around a focus ring included in the substrate processing apparatus 10 according to the present embodiment, wherein FIG. 4A shows the substrate processing apparatus 10 according to the present embodiment, FIG. 4B shows a first modified example of the substrate processing apparatus 10 according to the present embodiment, FIG. 4C shows a second modified example of the substrate processing apparatus 10 according to the present embodiment, and FIG. 4D shows a third modified example of the substrate processing apparatus 10 according to the present embodiment.

Referring to FIG. 4A, the substrate processing apparatus 10 further includes a ground member 41 (plasma biasing apparatus) that is formed of a semiconductor or conductor, for example, silicon, and is disposed on an outer portion of the side surface protective member 26 and below the outer focus ring 25b. An electric potential of the ground member 41 is maintained at a ground level.

According to the present embodiment, since the ground member 41 is disposed around the outer focus ring 25b, an electric potential of the outer focus ring 25b is close to the ground potential. In addition, a negative bias potential is generated on the susceptor 12 or the inner focus ring 25a, and thus the electric potential of the outer focus ring 25b is relatively high, and electrons are easily attracted. Accordingly, a thickness of a sheath facing the outer focus ring 25b may be increased greatly, and plasma in the inner space of the processing chamber 15 may be biased from a position facing the outer focus ring 25b toward a position facing the inner focus ring 25a. Therefore, a density of plasma facing the first gap or the second gap may be increased, and plasma entering the first gap or the second gap may be increased. Consequently, the decomposition and removal by plasma of deposits in the first gap or the second gap may be accelerated, and there is no need to wash the inner focus ring 25a or the susceptor 12 clean of deposits. Accordingly, deposits attached on the inner focus ring 25a having the lower temperature in the first gap and deposits attached on the susceptor 12 having the lower temperature in the second gap may be removed without degrading the working ratio of the substrate processing apparatus 10.

In FIG. 4B, the substrate processing apparatus 10 further include a ground electrode 42 (plasma biasing apparatus) of a ground potential that is disposed around the outer focus ring 25b in the side surface protective member 26.

In the present embodiment, since the ground electrode 42 is disposed around the outer focus ring 25b, the electric potential of the outer focus ring 25b is close to the ground potential. Accordingly, plasma in the inner space of the processing chamber 15 may be biased from a position facing the outer focus ring 25b toward a position facing the inner focus ring 25a. Therefore, a density of plasma facing the first gap or the second gap may be increased, and thus deposits attached on the inner focus ring 25a having the lower temperature in the first gap and deposits attached on the susceptor 12 having the lower temperature in the second gap may be removed without degrading the working ratio of the substrate processing apparatus 10.

In FIG. 4C, the substrate processing apparatus 10 further include a positive potential electrode 43 (plasma biasing apparatus) to which a positive direct current voltage is applied and which is disposed around the outer focus ring 25b in the side surface protective member 26.

In the present embodiment, since the positive potential electrode 43 is disposed around the outer focus ring 25b, the outer focus ring 25b also has a positive potential. Therefore, plasma in the inner space of the processing chamber 15 may be biased from a position facing the outer focus ring 25b toward a position facing the inner focus ring 25a. Accordingly, a density of plasma facing the first gap or the second gap may be increased, and thus deposits attached on the inner focus ring 25a having the lower temperature in the first gap and deposits attached on the susceptor 12 having the lower temperature in the second gap may be removed without degrading the working ratio of the substrate processing apparatus 10.

In FIG. 4D, the substrate processing apparatus 10 further include an electromagnet 44 (plasma biasing apparatus) disposed around the first gap below the focus ring 25.

In the present embodiment, the electromagnet 44 generates a magnetic field based on the first gap such that plasma in the inner space of the processing chamber 15 may be biased from a position facing the outer focus ring 25b toward a position facing the inner focus ring 25a. Accordingly, a density of plasma facing the first gap or the second gap may be increased, and thus deposits attached on the inner focus ring 25a having the lower temperature in the first gap and deposits attached on the susceptor 12 having the lower temperature in the second gap may be removed without degrading the working ratio of the substrate processing apparatus 10.

The embodiments of the present invention are described as above; however, the present invention is not limited to the above embodiments.

In addition, each of the above embodiments may be applied to a substrate processing apparatus that processes various substrates used in flat panel displays (FPDs) including liquid crystal displays (LCDs), photomasks, CD substrates, or print substrates by using plasma, as well as to the substrate processing apparatus 10, which performs a plasma etching process on the wafer W for forming a semiconductor device.

The embodiments of the present invention for removing deposits attached on the inner focus ring 25a of the lower temperature in the first gap and removing deposits attached on the susceptor 12 of the lower temperature in the second gap without degrading the working ratio of the substrate processing apparatus 10 are described as above. However, if attachment of deposits in the first gap or the second gap may be restrained in a plasma etching process, deposits may be removed more definitely than with respect to the above described embodiments.

Hereinafter, examples of a substrate processing apparatus capable of restraining attachment of deposits will be described. Each of the following examples may be used in combination with the above embodiments of the present invention.

Figure 5B:
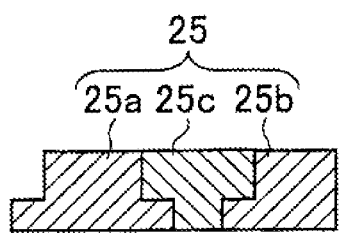
Figure 5C:
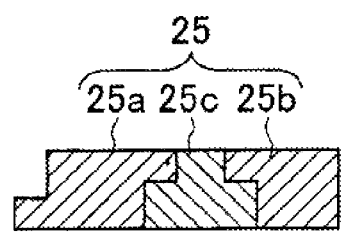
Figure 5D:
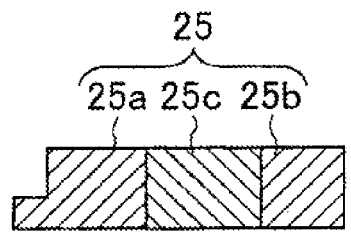
Figure 5E:
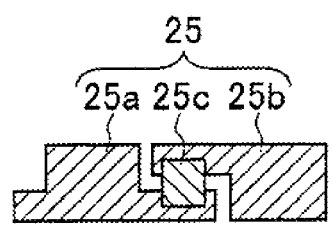
Figure 5F:
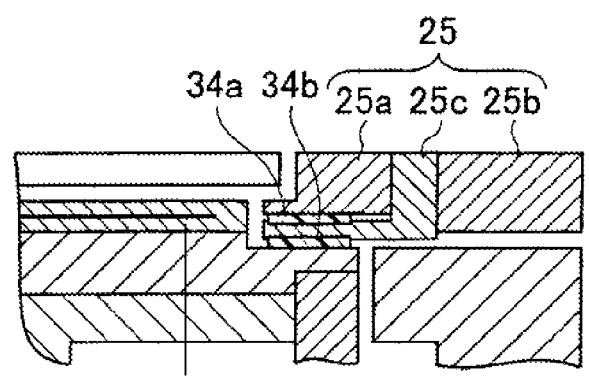

FIGS. 5A through 5F are magnified cross-sectional views schematically showing a configuration of a focus ring included in the substrate processing apparatus 10 that may restrain attachment of deposits according to an embodiment of the present invention, wherein FIG. 5A shows a first example, FIG. 5B shows a second example, FIG. 5C shows a third example, FIG. 5D shows a fourth example, FIG. 5E shows a fifth example, and FIG. 5F shows a sixth example.

In FIG. 5A, the focus ring 25 includes a block member 25c formed of quartz disposed in the first gap.

When a plasma etching process is performed on the wafer W in the substrate processing apparatus 10, plasma, in particular, radicals, enter the first gap and contact the block member 25c, and then a chemical reaction between the plasma and the quartz occurs and oxygen radicals are generated from the block member 25c. When reaction products are attached to the inner focus ring 25a in the first gap as deposits, oxygen radicals chemically react immediately with attached deposits to decompose and remove the deposits. Accordingly, attachment of deposits on the inner focus ring 25a in the first gap, in which a difference between temperatures is large, may be restrained.

Whenever oxygen radicals are generated in the first gap, attachment of deposits on the inner focus ring 25a may be restrained, and thus there is no limitation in a shape or a size of the block member 25c, provided that the block member 25c exists in the first gap. Therefore, the block member 25c may have a cross-sectional shape that is convex downward (FIG. 5B), convex upward (FIG. 5C), or a rectangular cross-section (FIG. 5D); however, a part of the block member 25c may be exposed in the inner space of the processing chamber 15. Accordingly, contact of plasma to the block member 25c may be promoted such that oxygen radicals may be definitely generated from the block member 25c. In addition, the block member 25c may not be directly exposed in the inner space of the processing chamber 15, provided that the block member 25c may contact plasma entering the first gap (FIG. 5E).

In addition, the block member 25c may be disposed between a lower surface of the inner focus ring 25a and the step on the susceptor 12 (FIG. 5F). Accordingly, introducing of reaction products that become a source of deposits between the lower surface of the inner focus ring 25a and the step of the susceptor 12 may be prevented, and at the same time, oxygen radicals are generated by the block member 25c between the lower surface of the inner focus ring 25a and the step of the susceptor 12. Thus, decomposition and removal of deposits by oxygen radicals may be accelerated between the lower surface of the inner focus ring 25a and the step of the susceptor 12. Also, in this case, heat transferring sheets 34a and 34b are respectively disposed between the step of the susceptor 12 and the block member 25c, and between the block member 25c and the inner focus ring 25a.

Since the block member 25c is formed of quartz, silicon radicals, as well as oxygen radicals, are generated when the block member 25c chemically reacts with the plasma. Since the silicon radicals might be attached to other components disposed in the inner space of the processing chamber 15 as elemental silicon or silicon oxide after combining with an oxygen gas, a fluorocarbon-based processing gas may be introduced in the inner space of the processing chamber 15. Since plasma generated from a fluorocarbon-based processing gas decomposes the silicon or silicon carbide, attachment of the silicon or the silicon carbide onto the other components may be restrained.

The substrate processing apparatus capable of restraining attachment of deposits in the first gap is described as above; however, as described above, deposits may be attached in the second gap. Hereinafter, a substrate processing apparatus capable of restraining attachment in the second gap will be described as follows.

Figure 6A:
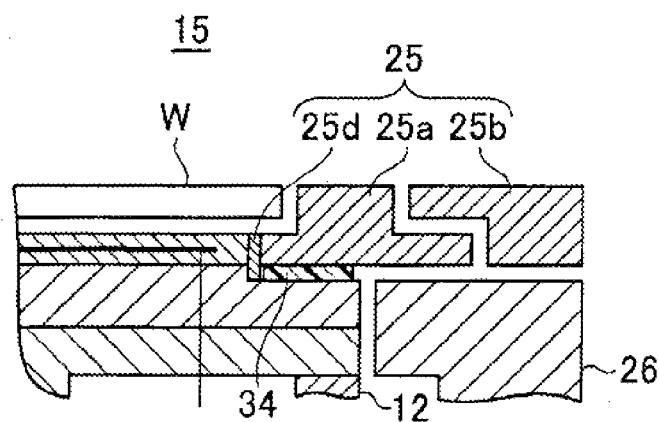
Figure 6B:
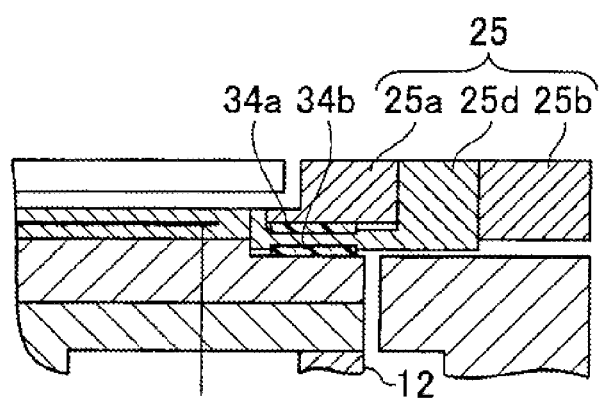
Figure 6C:
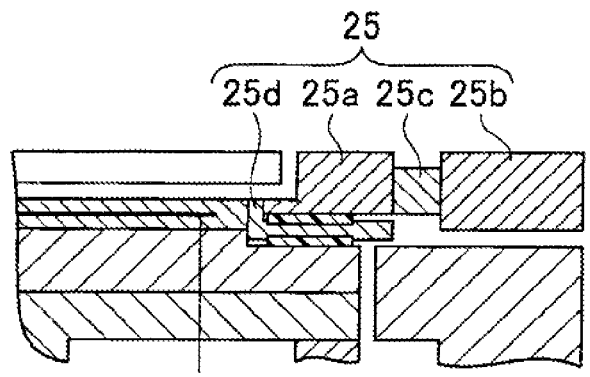
Figure 6D:
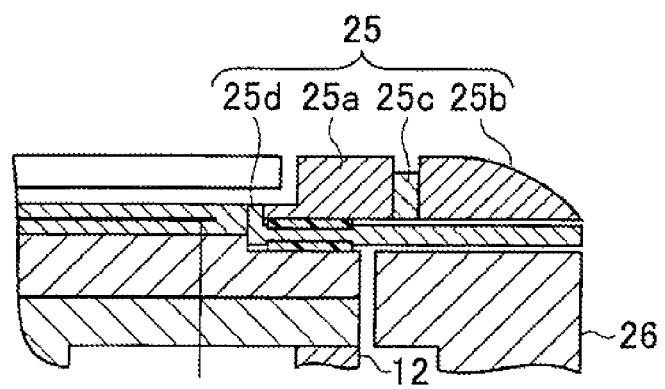

FIGS. 6A through 6D are magnified cross-sectional views schematically showing a configuration of a focus ring included in the substrate processing apparatus 10 that may restrain attachment of deposits according to the embodiment of the present invention, wherein FIG. 6A shows a seventh example, FIG. 6B shows an eighth example, FIG. 6C shows a ninth example, and FIG. 6D shows a tenth example.

In FIG. 6A, the focus ring 25 includes a block member 25d formed of quartz and disposed in the second gap.

When a plasma etching process is performed on the wafer W in the substrate processing apparatus 10, plasma, in particular, radicals, enter the second gap and contact the block member 25d, and then oxygen radicals are generated from the block member 25d. Oxygen radicals chemically react with attached deposits in the second gap to decompose and remove the deposits. Accordingly, attachment of deposits on the susceptor 12 of the lower temperature in the second gap where there is a large temperature difference may be restrained.

Whenever oxygen radicals are generated in the second gap, attachment of deposits on the susceptor 12 may be restrained, and thus there is no limitation in a shape or a size of the block member 25d, provided that the block member 25d exists in the second gap. Also, the block member 25d may be disposed between the lower surface of the inner focus ring 25a and the step on the susceptor 12 (FIG. 6B). Accordingly, it may be prevented that reaction products that are a source of deposits are introduced between the lower surface of the inner focus ring 25a and the step on the susceptor 12, and at the same time, the block member 25d generates oxygen radicals between the lower surface of the inner focus ring 25a and the step on the susceptor 12. Therefore, decomposition and removal of deposits between the lower surface of the inner focus ring 25a and the step of the susceptor 12 may be accelerated by oxygen radicals. In addition, in this case, the heat transferring sheets 34a and 34b are respectively disposed between the step of the susceptor 12 and a lower surface of the block member 25d, and between an upper surface of the block member 25d and the inner focus ring 25a.

Also, the block member 25d may be elongated, and the elongated portion may be disposed in the first gap (FIG. 6B). Accordingly, attachment of deposits onto the components in the first gap and the second gap may be prevented simultaneously.

In addition, the focus ring 25 may include the block member 25c illustrated in the above first through fifth examples, as well as the block member 25d (FIG. 6C). The block member 25d may be disposed between the lower surface of the outer focus ring 25b and the side surface protective member 26, as well as between the lower surface of the inner focus ring 25a and the step on the susceptor 12 (FIG. 6D).

Hereinafter, a substrate processing apparatus capable of restraining the attachment of the deposits in the second gap, as well as in the first gap, will be described as follows.

Figure 7A:
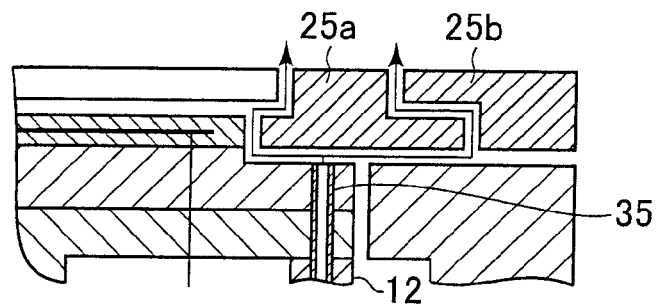
Figure 7B:
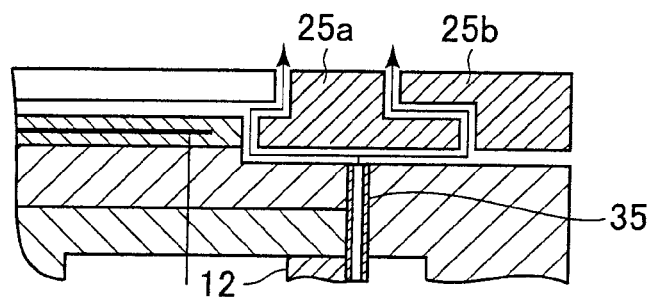

FIGS. 7A and 7B are magnified cross-sectional view schematically showing a configuration of a focus ring included in the substrate processing apparatus 10 that may restrain attachment of deposits according to the embodiment of the present invention, wherein FIG. 7A shows an eleventh example and FIG. 7B shows a twelfth example.

In FIG. 7A, the substrate processing apparatus 10 includes a gas supply hole 35 opening in the step of the susceptor 12 and facing the lower surface of the inner focus ring 25a. The gas supply hole 35 supplies a predetermined gas, for example, an oxygen gas, toward the lower surface of the inner focus ring 25a, when the plasma etching process or a cleaning process using the plasma, for example, a WLDC process, is performed in the substrate processing apparatus 10. The supplied oxygen gas (denoted as arrows in the drawings) flows between the step of the susceptor 12 and the lower surface of the inner focus ring 25a to be supplied to the first gap and the second gap.

The oxygen gas supplied to the first gap or the second gap contacts plasma that enters the first gap or the second gap to generate oxygen radicals. Oxygen radicals chemically react with deposits in the first gap or the second gap to decompose and remove the deposits. Therefore, it may be prevented that deposits are attached to the susceptor 12 or on the inner focus ring 25a in the first gap or the second gap where there is a large temperature difference. In addition, an oxygen gas flowing in the first gap or the second gap pushes reaction products that are a source of deposits entering the first gap or the second gap to the inner space of the processing chamber 15, and thus attachment of deposits in the first gap or the second gap may be definitely prevented.

In the above eleventh example, the gas supply hole 35 is formed in the step of the susceptor 12; however, a location of forming the gas supply hole 35 is not limited to the step of the susceptor 12, provided that a gas may be supplied to the first gap or the second gap. For example, the gas supply hole 35 may be formed between the susceptor 12 and the side surface protective member 26 (FIG. 7B), or may be formed in the side surface protective member 26 (not shown).

Also, the gas supplied from the gas supply hole 35 is not limited to an oxygen gas, and may be an inert gas, for example, a rare gas or a nitrogen gas, or a processing gas. The inert gas pushes reaction products that enter the first gap or the second gap, and moreover, an inert gas does not react with plasma entering the first gap or the second gap and does not generate new reaction products. Thus, an inert gas may prevent attachment of deposits in the first gap or the second gap more definitely. The processing gas also pushes reaction products entering the first gap or the second gap. Moreover, even when a processing gas leaks into the inner space of the processing chamber 15, the processing gas does not affect components of plasma, and accordingly, it may be prevented that a plasma etching process that is different from a desired process is performed on the wafer W.

In addition, when the gas supply hole 35 supplies an oxygen gas or a processing gas and the supplied gas leaks into the inner space of the processing chamber 15, the gas may affect a density or a distribution of plasma in the inner space. Thus, in the substrate processing apparatus 10, a supplied amount of an oxygen gas or a processing gas supplied from a part of the shower head 27 facing the first gap or the second gap, may be reduced.

Figure 8:
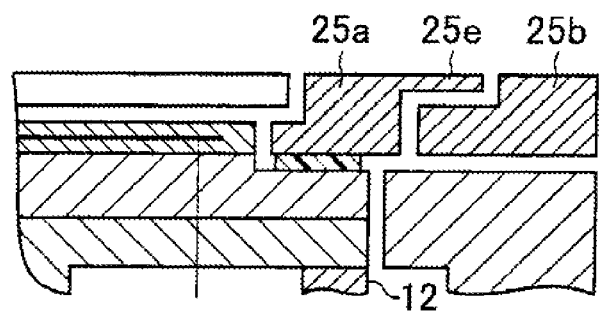
FIG. 8 is a magnified cross-sectional view schematically showing a configuration of a thirteenth example of a focus ring included in a substrate processing apparatus that may restrain the attachment of deposits.

FIG. 8 is a magnified cross-sectional view schematically showing a thirteenth example of a configuration of a focus ring included in the substrate processing apparatus 10 that may restrain the attachment of deposits.

In FIG. 8, the inner focus ring 25a includes a thin-plate shaped flange portion 25e that is exposed in the inner space of the processing chamber 15 and protruded to cover the outer focus ring 25b at a side of the inner space of the processing chamber 15. The flange portion 25e forms the first gap with a facing surface of the outer focus ring 25b. The flange portion 25e has a thickness ranging from 1.7 mm to 2.0 mm.

Since the flange portion 25e has a small thermal capacity because of its thin thickness, when the plasma etching process or a WLDC process is performed in the substrate processing apparatus 10, a temperature of the flange portion 25e rises higher than those of other portions in the inner focus ring 25a due to radiation heat from plasma. Accordingly, a temperature difference between the inner focus ring 25a and the outer focus ring 25b may be reduced in the first gap, and thus attachment of deposits on the inner focus ring 25a in the first gap may be restrained. In addition, even if deposits are attached on the inner focus ring 25a in the first gap, the deposits may be decomposed and removed by radiation heat from the flange portion 25e or the outer focus ring 25b of a high temperature.

In the thirteenth example, since the flange portion 25e covers the outer focus ring 25b, the first gap shows a labyrinth-like structure. Therefore, it is difficult for reaction products that are a source of deposits to enter the first gap at a side of the susceptor 12, and accordingly attachment of deposits in the first gap may be definitely prevented.

Since the minimum thickness of the flange portion 25e is 1.7 mm, excessive degradation of strength of the flange portion 25e may be prevented, and thus damage of the flange portion 25e when the inner focus ring 25a is replaced may be prevented. Also, since the maximum thickness of the flange portion 25e is 2.0 mm and thus thermal capacity of the flange portion 25e is large, it may be prevented that the temperature of the flange portion 25e does not rise even with radiation heat of plasma received.

According to the present invention, since the laser beam transmission member that transmits a laser beam has a facing surface that faces the gap between the inner focus ring and the outer focus ring, a laser beam that has passed through the laser beam transmission member is irradiated toward the gap between the inner focus ring and the outer focus ring to raise the temperature of deposits in the gap between the inner focus ring and the outer focus ring, and decomposition and removal of deposits may be accelerated. Accordingly, there is no need to wash the inner focus ring clean of deposits attached thereon, and thus deposits are removed from the inner focus ring having the lower temperature between the inner and outer focus rings, the temperatures of which are largely different from each other without degrading the working ratio of the substrate processing apparatus.

According to the present invention, the focus ring moving apparatus moves at least one of the inner focus ring and the outer focus ring so as to expose the inner focus ring in the processing space, in which plasma is generated, of the processing chamber, and thus deposits in the gap between the inner and outer focus rings may contact plasma to accelerate decomposition and removal thereof. Accordingly, there is no need to wash the inner focus ring clean of deposits, and thus deposits are removed from the inner focus ring having the lower temperature between the inner and outer focus rings, the temperatures of which are different from each other a lot, without degrading the working ratio of the substrate processing apparatus.

According to the present invention, the plasma biasing apparatus increases a density of plasma that faces the gap between the inner and outer focus rings, and thus an amount of plasma entering the gap between the inner and outer focus rings may be increased and decomposition and removal by plasma of deposits in the gap between the inner and outer focus rings may be accelerated. Accordingly, there is no need to wash the inner focus ring clean of deposits, and thus deposits are removed from the inner focus ring having the lower temperature between the inner and outer focus rings, the temperatures of which are different from each other a lot, without degrading the working ratio of the substrate processing apparatus.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A substrate processing apparatus comprising:
  a processing chamber which receives a substrate;
  a focus ring which surrounds a periphery of the substrate disposed in the processing chamber;

a laser beam transmission member which transmits a laser beam; and a laser beam irradiating apparatus which irradiates a laser beam to the laser beam transmission member, wherein the focus ring comprises an inner focus ring which is disposed adjacent to the substrate and is cooled down, and an outer focus ring that surrounds the inner focus ring and is not cooled down, a gap is provided between the inner focus ring and the outer focus ring, and the laser beam transmission member is provided only below the outer focus ring and has a slant facing surface that faces a side surface of the inner focus ring such that the laser beam is irradiated toward the side surface of the inner focus ring from the slant facing surface.

2. The substrate processing apparatus of claim 1, wherein the laser beam transmission member is formed of quartz, the outer focus ring is formed of silicon or silicon carbide, and the laser beam has a wavelength of 1100 nm or less.

3. The substrate processing apparatus of claim 2, wherein the laser beam irradiating apparatus also irradiates laser beams that are different from the laser beam having the wavelength of 1100 nm or less.

4. The substrate processing apparatus of claim 1, wherein the inner focus ring and the outer focus ring are formed of silicon or silicon carbide, and the laser beam has a wavelength greater than 1100 nm.

* * * * *